(12) United States Patent
Mallik et al.

(10) Patent No.: US 7,268,425 B2
(45) Date of Patent: Sep. 11, 2007

(54) THERMALLY ENHANCED ELECTRONIC FLIP-CHIP PACKAGING WITH EXTERNAL-CONNECTOR-SIDE DIE AND METHOD

(75) Inventors: Debendra Mallik, Chandler, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 248 days.

(21) Appl. No.: 10/382,680

(22) Filed: Mar. 5, 2003

(65) Prior Publication Data

US 2004/0173901 A1    Sep. 9, 2004

(51) Int. Cl.
*H01L 23/10* (2006.01)

(52) U.S. Cl. .............. 257/706; 257/707; 257/720; 257/766; 257/E23.101

(58) Field of Classification Search ............... 257/706, 257/707, 720, 766, E23.101, E23.105
See application file for complete search history.

(56) References Cited

U.S. PATENT DOCUMENTS

| 4,381,506 | A | * | 4/1983 | Linn et al. ............. 340/870.32 |
| 4,908,546 | A | * | 3/1990 | Shaffer et al. ............. 313/331 |
| 4,969,842 | A | * | 11/1990 | Davis ......................... 439/629 |
| 5,151,777 | A | * | 9/1992 | Akin et al. ................. 257/712 |
| 5,250,755 | A | * | 10/1993 | Dinzen et al. ........ 174/102 SC |
| 5,601,924 | A | * | 2/1997 | Beane et al. ................ 428/403 |
| 5,681,663 | A | * | 10/1997 | Schaller et al. ............. 428/614 |
| 6,114,048 | A | | 9/2000 | Jech et al. |
| 6,362,530 | B1 | * | 3/2002 | Lee et al. .................... 257/778 |
| 6,490,161 | B1 | | 12/2002 | Johnson |
| 6,878,247 | B2 | * | 4/2005 | Duruz et al. ................ 204/293 |
| 6,998,032 | B2 | * | 2/2006 | De Nora et al. ............ 204/293 |
| 2003/0157810 | A1 | * | 8/2003 | Honda ........................ 438/745 |

* cited by examiner

*Primary Examiner*—Thao P. Le
(74) *Attorney, Agent, or Firm*—Schwegman, Lundberg, Woessner & Kluth P.A.

(57) ABSTRACT

A method and apparatus for making a package having improved heat conduction characteristics and high frequency response. A relatively thick package substrate, such as copper, has a wiring layer bonded to one face, leaving the opposite face exposed, for example, to be a surface for connection to a heat sink. One ore more chips are bonded to the wiring layer, and an array of connectors, such as solder balls are provided around the periphery of the chip(s) for connection to a printed circuit board. In some embodiments, the printed circuit board has a hole that the chip(s) extend into to allow smaller external-connection solder balls. In some embodiments, a second heat sink is connected to the back of the chip through the PCB hole.

12 Claims, 6 Drawing Sheets

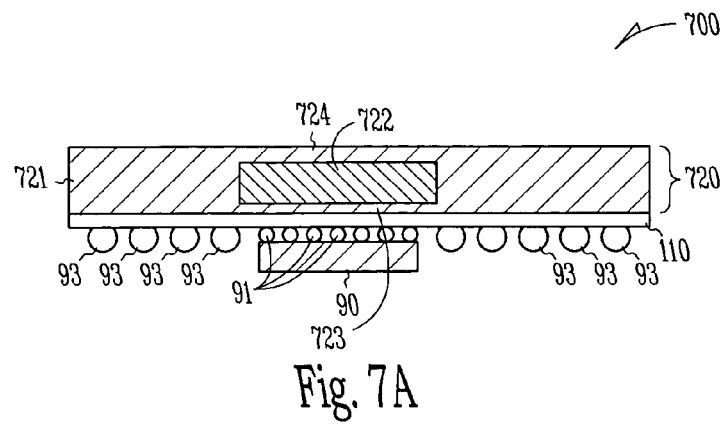
Fig. 7A
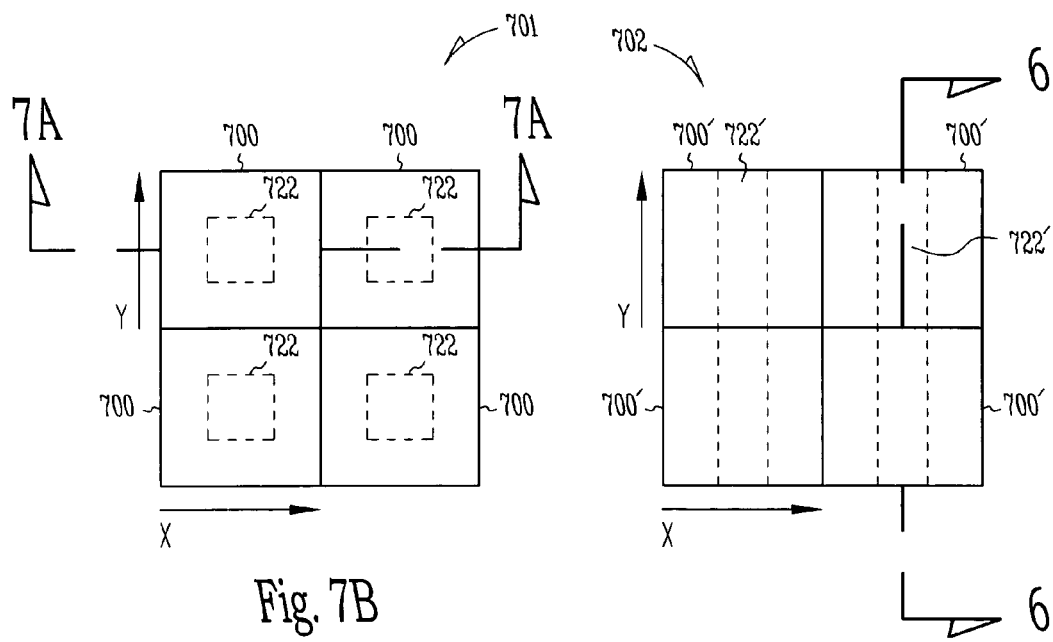
Fig. 7B
Fig. 7C

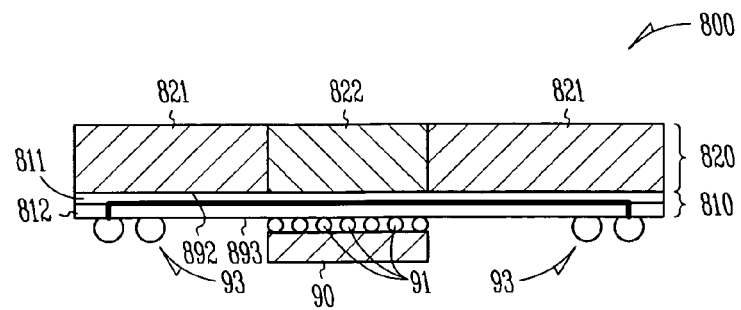
Fig. 8A
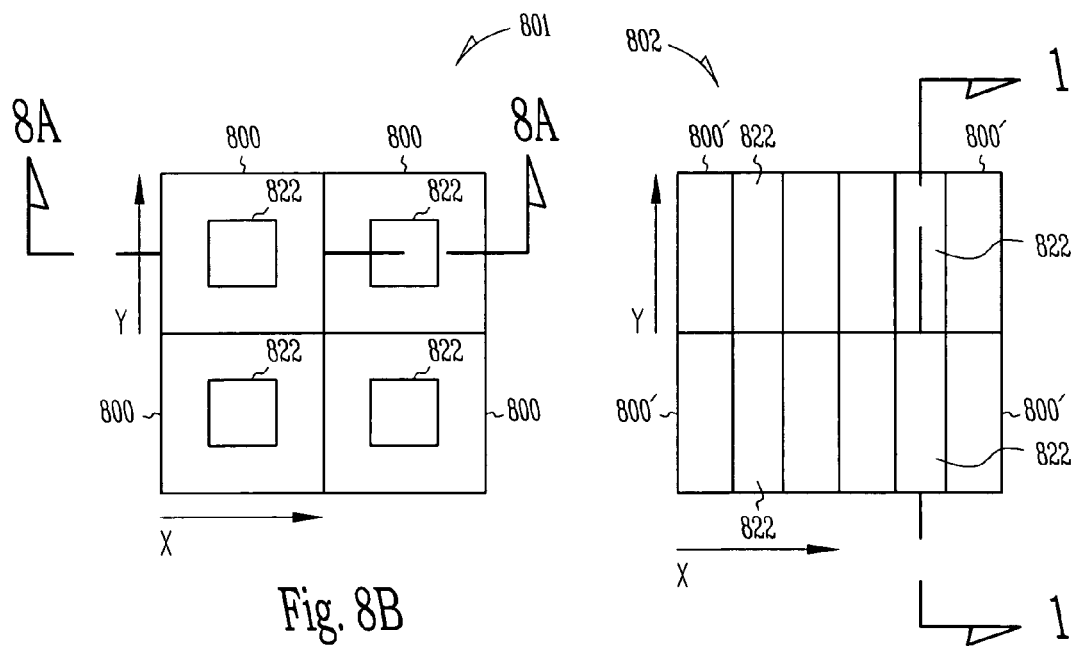
Fig. 8B
Fig. 8C

THERMALLY ENHANCED ELECTRONIC FLIP-CHIP PACKAGING WITH EXTERNAL-CONNECTOR-SIDE DIE AND METHOD

FIELD OF THE INVENTION

This invention relates to the field of electronic package fabrication, and more specifically to a method and apparatus of making a thermally enhanced electronic flip-chip/solder-ball package with a chip die being on the same side of the package as the external-connectors.

BACKGROUND OF THE INVENTION

Bare electronic chips typically need to be packaged in a package that provides an electric circuit to each electrical connection of the chip and to an external connector such as a pin or a ball. Typical is a pin-grid array package having relatively large pins on one side for external connections, and pads on an opposite side for connections to a ball-grid-array set of connections to the electronic chip (such as a processor or memory chip). Also typical is a ball-grid array package having relatively large balls (e.g., in a ball-grid array) with relatively large spacings on one side of the package for external connections, and small closely spaced pads on the same side for connections to a ball-grid-array set of connections to the electronic chip (such as a processor or memory chip).

Such a package typically has a non-conductive substrate (such as a plastic film or layer) with conductive traces (wires) on or in a surface of the substrate. Some packages include multiple chips, such as one or more logic or processor chips, and/or one or more memory chips, such as a FLASH-type reprogrammable non-volatile memory. Balls and/or pins are attached to the outside of the package, and one or more electronic chips are attached, for example, by also using ball-grid-array connection methods and/or flying-wire methods. Optionally, a cover or encapsulant is used to enclose the chip or chips.

One conventional way to make such a package is to start with a sheet or strip of non-conductive material such as Mylar film or a fiberglass reinforced epoxy substrate, then deposit a film of metal such as copper, then pattern and etch the metal to leave traces. Sometimes, through-hole vias connect traces on one side or internal layer to traces on the other side or another internal layer. The chips are then connected to pads on the traces and sometimes encapsulated to form the package. Such packaging typically has poor thermal conductivity.

Chips that run at extremely high frequencies, e.g., upwards of 40 gigahertz, also have constraints as to the type, thickness, spacing, and layout of traces required to provide adequate signal capability. Further, such chips typically need to be run at very low voltages (e.g., about one volt) and very high currents (e.g., one hundred amps), which must be provided in order to achieve the desired high frequencies.

What is needed is a simple, inexpensive, reliable method and apparatus to fabricate packages for electronic chips, so that the package provides high heat conductivity and dissipation, and high frequency response.

BRIEF DESCRIPTION OF THE DRAWINGS

FIG. 7A is a cut-away schematic view of a ball-side-die package 700.

FIG. 7B is a top view of a sheet 701 to be cut into a plurality of ball-side-die packages 700'.

FIG. 7C is a top view of a sheet 702 to be cut into a plurality of ball-side-die packages 700.

FIG. 8A is a cut-away schematic view of a ball-side-die package 800.

FIG. 8B is a top view of a sheet 801 to be cut into a plurality of ball-side-die packages 800'.

FIG. 8C is a top view of a sheet 802 to be cut into a plurality of ball-side-die packages 800.

DESCRIPTION OF PREFERRED EMBODIMENTS

Figure 1:
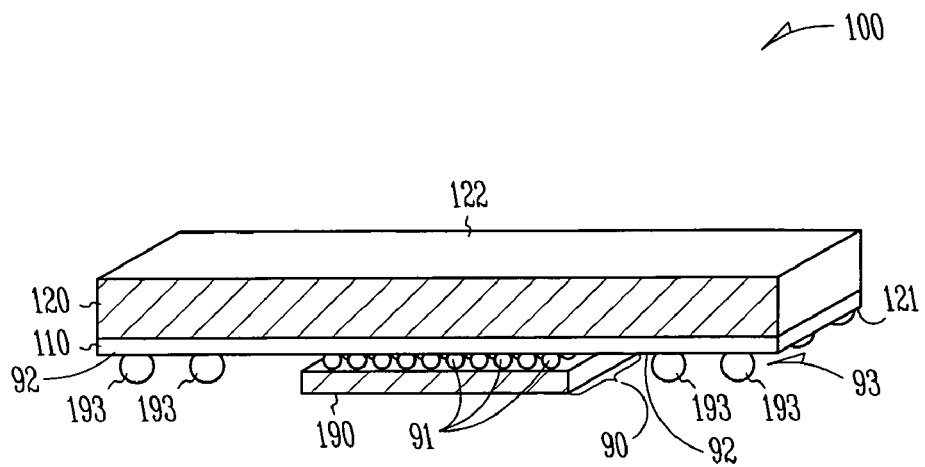
FIG. 1 is a perspective cut-away schematic view of an external-connector-side package 100.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

TERMINOLOGY

The terms chip, die, integrated circuit, monolithic device, semiconductor device, and microelectronic device, are used interchangeably in this description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

In this description, the term metal applies both to substantially pure single metallic elements and to alloys or combinations of two or more elements, at least one of which is a metallic element.

The term substrate or core generally refers to the physical object that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting, or combinations of semiconducting and non-semiconducting materials, or other combinations of some of the above materials. In some embodiments, substrates include layered structures, such as a core sheet or piece of material (such as iron-nickel alloy) chosen for its a coefficient of thermal expansion (CTE) that more closely matches the CTE of an adjacent structure such as a silicon processor chip. In some embodiments, such a substrate core is laminated to a sheet of material chosen for electrical and/or thermal conductivity (such as a copper or aluminum alloy), which in turn is covered with a layer of plastic chosen for electrical insulation, stability, and embossing characteristics. In some embodiments, the plastic has wiring traces deposited in one or more layers separated by insulator material such as plastic.

The term vertical is defined to mean substantially perpendicular to the major surface of a substrate. Height or depth refers to a distance in a direction perpendicular to the major surface of a substrate.

FIG. 1 is a perspective cut-away schematic view of an external-connector-side-die package 100. Package 100 includes a thermally conductive core 120 having a first face 121 to which an electrically insulating layer 110 (having wiring traces) is attached, and a second face 122, which is exposed. In some embodiments, core 120 is made of a metal such as a uniform sheet of copper or a copper alloy, or having a laminated or plated structure such as a layer of iron-nickel alloy also has a layer or foil that includes copper attached on one or both faces. Layer 110 has one or more layers of wiring 92 in or on it. In some embodiments, the external connections include a plurality of solder balls 193, arranged, for example, in a ball-grid array.

The reference number 90 refers generally to any chip that is attached to the underside of substrate 120 and insulating layer 110, while numbers such as 190, 290, 390, etc., refer to different embodiments wherein certain special features of the chip are described. The reference number 93 refers generally to any external connector that is attached to the underside of substrate 120 and insulating layer 110, while numbers such as 193, 493, 593, etc., refer to different embodiments wherein certain special features of the connectors are described.

In some embodiments, insulating layer 110 includes a plurality of insulating sheets bonded to one another in a stack, with one level of wiring layer 92 between each sheet. In some embodiments, one level of wiring layer 92 is on the bottom surface of insulating layer 110 as shown. In some embodiments, a pad at one end of each wiring trace provides a contact point for one of the solder balls 91 connecting to chip 90, and a larger pad at the opposite end and provides a contact point for one of the external connections 93.

A chip 90, having circuitry thereon such as a processor, memory, or other logic or analog circuit, is attached to wiring layer 92, for example, by using solder balls 91. In some embodiments, chip 90 is a thinned chip 190 as shown in FIG. 1, wherein the chip is thinned after circuitry is formed, for example, by chemical-mechanical polishing (CMP) or other suitable thinning method. In some embodiments, a thinned chip is needed due to the relatively small size of solder balls 193 used for connectors 93, since if chip 90 is thicker than a diameter of solder balls 193 and is placed against a planar printed circuit motherboard, then the solder balls 193 would not reach the printed circuit motherboard. Thus, in some embodiments, by providing a sufficiently thinned chip 190, the proper contact between the small solder balls 193 and the printed circuit board is achieved. In other embodiments, the chip 90 is not thinned, but rather the solder balls 193 are made of a sufficiently large diameter (i.e., larger than the thickness of chip 90) so that when mounted the solder balls reach to the PCB below them.

Figure 2:
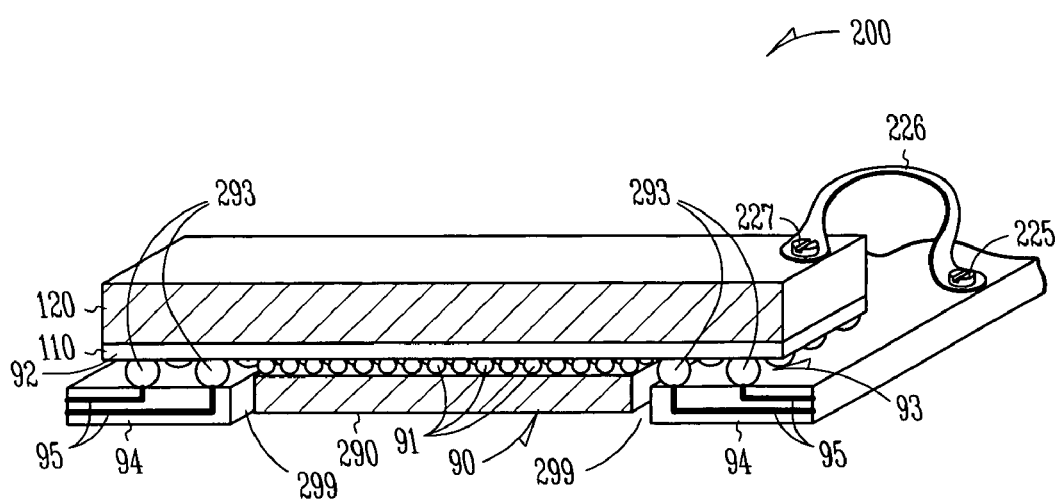
FIG. 2 is a perspective cut-away schematic view of a ball-side-die package 200.

FIG. 2 is a perspective cut-away schematic view of a ball-side-die package 200. In this embodiment, a hole 299 is cut in printed circuit board 94, in order that a relatively thick chip 290 (i.e., a chip 90 that has a thickness about as large as, or larger than, the diameter of solder balls 293 used for connectors 93) can have a thickness that extends into the hole 299, thus allowing connectors 93 to properly attach to PCB 94. In some embodiments, heat dissipation through the hole is facilitated, e.g., for connection to a heat sink or for blown air. PCB 94 typically has a plurality of wiring traces 95 in a plurality of layers in and on the PCB.

In some embodiments, a high-current-capable conductor 226 (such as a braided copper strap or other suitable conductor) is attached by connector 227 (e.g., a bolt screwed into a tapped hole, or other suitable connector) to substrate 120, and by connector 225 (e.g., also a bolt screwed into a tapped hole, or other suitable connector). In some embodiments, conductor 226 carries some or all of the current for the ground connection or for a power connection to chip 90. This is an important optional function for high-current (e.g., 100 amps), low-voltage (e.g., 1 volt) power supplies used for high-frequency (e.g., 40 gigahertz) processors and other logic or analog circuitry. In some embodiments, an electrical connection is made through insulating layer 110 for a plurality of connections from substrate 120 to solder balls 91 and then to chip 90.

Figure 3:
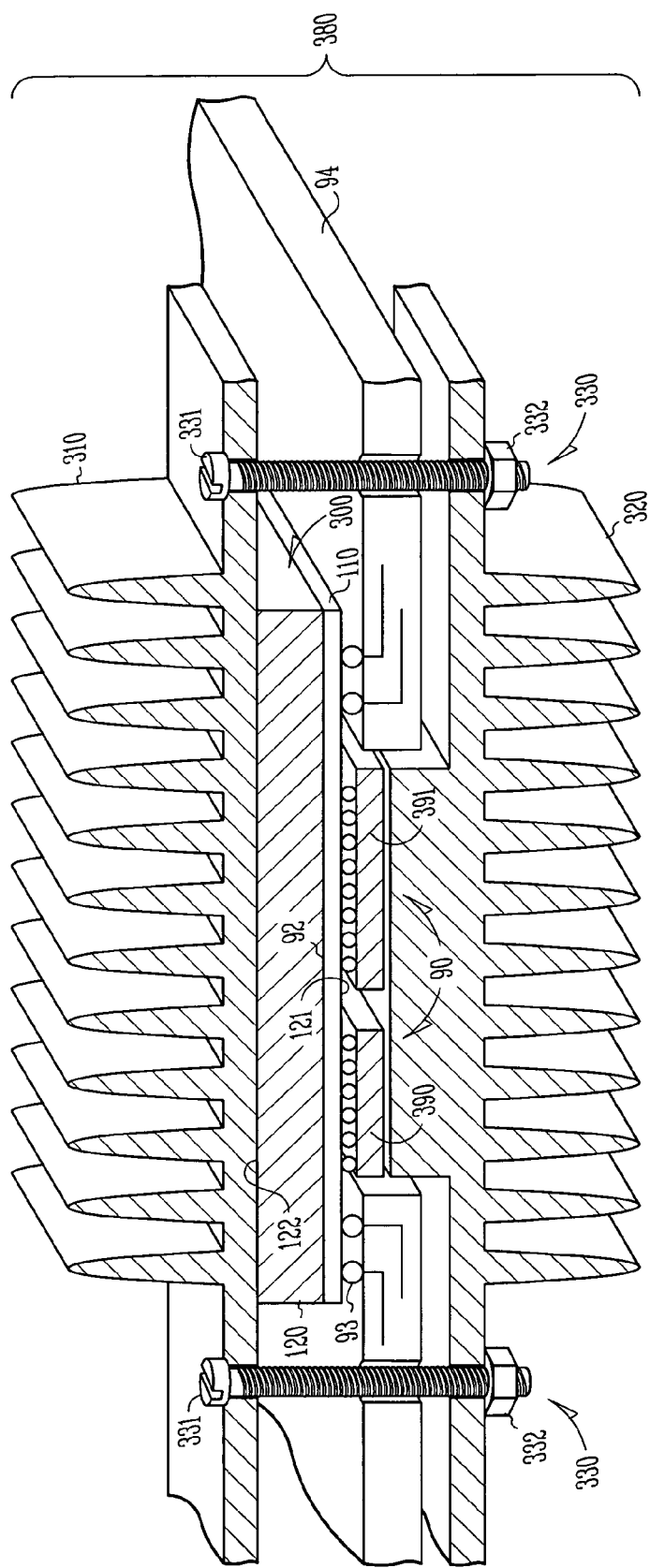
FIG. 3 is a perspective cut-away schematic view of a ball-side-die package 300 in an apparatus 380 having attached heat sinks.

FIG. 3 is a perspective cut-away schematic view of a ball-side-die package 300 in an apparatus 380 having attached heat sinks 310 and 320. Apparatus 380 includes PCB 94, chip package 300, and one or more heat sinks 310 and/or 320. Also shown is a plurality of chips 90 including a first chip 390 and a second chip 391. In some embodiments, upper heat sink 310 is attached to press against second face 122 of heat-conducting substrate 120 (optionally using heat-sink compound at the interface to improve heat conduction), and a lower heat sink 320 is attached to press against the back (lower face) of the one or more chips 90 (in this case, to chips 390 and 391, and optionally using heat-sink compound at the interface to improve heat conduction). In some embodiments, one or more tightenable and/or spring-loaded through-board fasteners 330 (such as bolts 331 and nuts 332) are used to connect heat sinks 310 and 320 to one another and/or to PCB 94. In other embodiments, other suitable methods and apparatus are used to hold the heat sink(s). Again, external connectors 93 (e.g., solder balls) attach wiring layer 92 to PCB 94.

Figure 4:
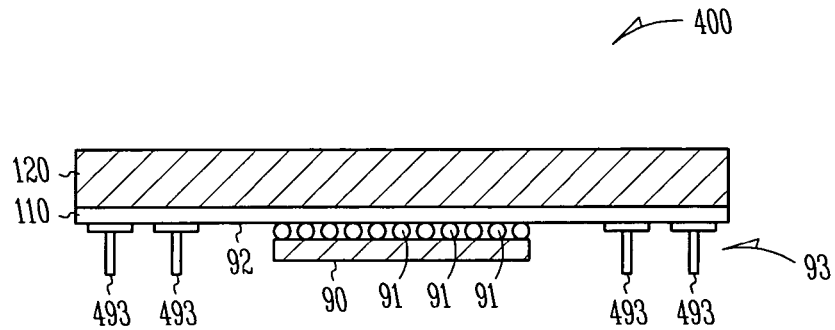
FIG. 4 is a cut-away schematic view of an external-connector-side die package 400 having pins.

FIG. 4 is a cut-away schematic view of an external-connector-side-die package 400 having a plurality of pins 493 used for connectors 93. Other features are as described in FIG. 1, such as chip 90 connected to wiring layer 92 by solder balls 91 (a flip-chip configuration). Wiring layer 92 is held by (i.e., in and/or on) insulating layer 110, which is bonded to heat-conducting substrate 120.

Figure 5:
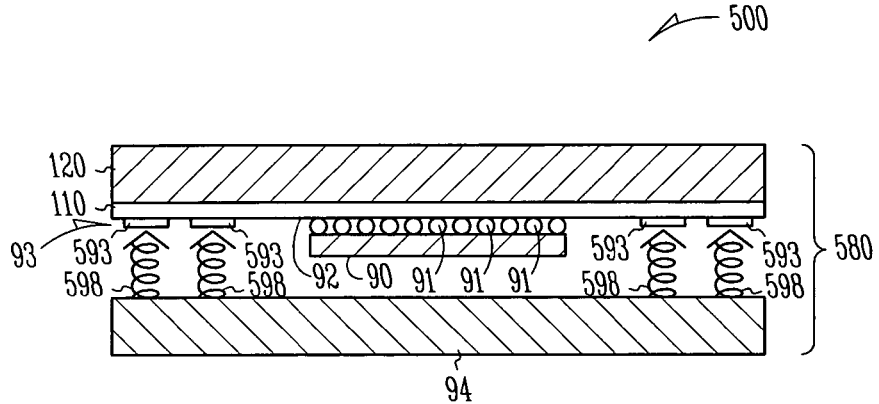
FIG. 5 is a cut-away schematic view of an external-connector-side package 500 having pads.

FIG. 5 is a cut-away schematic view of an apparatus 580 that includes external-connector-side-die package 500 having pads 593 used for external connectors 93. In the embodiment shown, PCB 94 includes a plurality of spring-loaded connectors 598, each of which contacts a corresponding pad 593. Other features are as described in FIG. 1, such as chip 90 connected to wiring layer 92 by solder balls 91 (a flip-chip configuration). Wiring layer 92 is held by (i.e., in and/or on) insulating layer 110, which is bonded to heat-conducting substrate 120.

Figure 6:
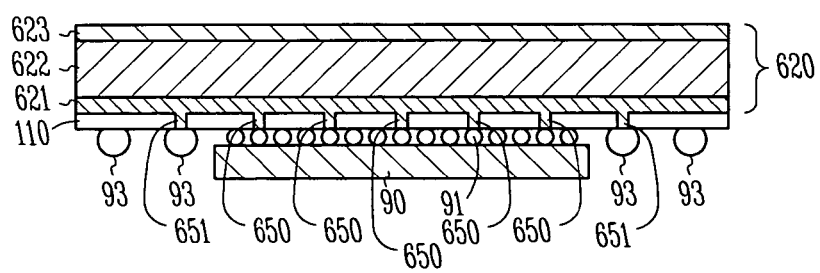
FIG. 6 is a cut-away schematic view of a ball-side-die package 600 having balls.

FIGS. 6, 7A, and 8A show cross section views of various embodiments of the substrate 120 used in FIGS. 1-5.

FIG. 6 is a cut-away schematic side view of a ball-side-die package 600 having balls for external connectors 93. In this embodiment, substrate 620 includes a sheet of core material 622 chosen to better match the CTE of chip 90, and at least one side of the core material 622 plated with or bonded to a layer (621 and/or 623) having high heat and/or electrical conductivity. In some embodiments, chip 90 is primarily silicon, and core material 622 includes an iron-nickel alloy, for example, alloys having approximately 42% (weight) nickel (sometimes called N42 alloy) or alloys having approximately 36% (weight) nickel (such as invar alloy), or alloys having Kovar® (about 53% Fe, 29% Ni, 17% Co, 1% Other) in order to match the CTE of the silicon chip 90. The CTE of silicon is about 2.6 to 2.9 times $10^{-6}$ per degree C. at 293 degrees Kelvin. The mean coefficient of thermal expansion (CTE) of Invar from 20-100° C. is less than about $1.3 \times 10^{-6\circ}$ C.$^{-1}$. The mean CTE for Kovar® is about $4.9 \times 10^{-6\circ}$ C.$^{-1}$. In some embodiments, an alloy (such as a nickel-iron alloy having Ni—Fe ratio between that of invar and that of N42) having a CTE that closely matches the CTE of chip 90 (e.g., of silicon), for the expected operating temperature range, is chosen. In some embodiments, a copper foil (or other foil having high thermal and/or electrical conductivity) is bonded directly to the bottom and/or top of the core 622, in order to keep the dimensional CTE properties of the core while improving the thermal and/or electrical properties of the composite substrate 620. In some embodiments, a plurality of copper plated-through holes 650 are formed from the copper layer 621 through the insulating layer 110 to solder balls 91, in order to improve electrical conductivity for a power-supply connection, as well as to improve thermal conductivity. In some embodiments, further additional solder balls are provided for such contacts, wherein such solder balls are not electrically connected, but are primarily to improve thermal conductivity from chip 90 to copper layer 621. In some embodiments, one or more of copper plated-through holes 651 are formed from the copper layer 621 through the insulating layer 110 to solder balls 93. In some embodiments, the top copper layer 623 is connected to the bottom copper layer 621 by a copper layer plated or bonded along the entire periphery of the package 600 substrate 620.

FIG. 7A is a cut-away schematic view of a ball-side-die package 700. Package 700 includes a substrate 720 having a core portion 722 surrounded by a thin copper layer 724 on top and/or a thin copper layer 723 on the bottom, as well as a solid copper peripheral skirt 721 to the sides. Core portion 722 is of a material chosen to provide an improved CTE match to that of chip 90. The increased amount of copper, as compared to package 600 of FIG. 6, increases the thermal conductivity, in some embodiments.

In some embodiments, the copper substrate starts as a large sheet (e.g., about 200 mm by 300 mm), which is bonded to wiring layer 110, and then cut into individual packages (such as 100, 600, 700, or 800). In some embodiments, one or more chips 90 are attached to each package before the packages are cut apart. In other embodiments, the packages are cut apart before the chips are attached.

FIG. 7B is a top view of a sheet 701 to be cut into a plurality of ball-side-die packages 700. In this embodiment, a separate rectangular slug of core material 722 is embedded into copper sheet 701 for each individual package 700, and the cross section is as shown in FIG. 7A in both the X and Y dimension.

FIG. 7C shows a top view of a sheet 702 to be cut into a plurality of ball-side-die packages 700'. In the embodiment shown, for each column of packages 700', a stripe of core material 722 extends the length of sheet 702, and thus each package 700' has a stripe of core material extending its length in one direction. The cross section in the X direction is as shown in FIG. 7A, but the core 722 in the Y direction extends the length of the package as shown in FIG. 6. This makes package 702 somewhat easier to make, but somewhat less thermally conductive.

FIG. 8A is a cut-away schematic view of a ball-side-die package 800. This package is identical to package 700 of FIG. 7, except that no copper layer (such as 723 or 724) is provided at the top or bottom of the core 822, which is chosen to provide an improved CTE match to that of chip 90. The increased amount of copper, as compared to package 600 of FIG. 6, increases the thermal conductivity, in some embodiments. Omitting the top and bottom copper layers makes package 800 somewhat easier to make, but somewhat less thermally conductive as compared to package 700 of FIG. 7A. In some embodiments, wiring layer 810 includes a plurality of wiring layers 892 and 893 that are separated from one another and from core 820 by insulating layers 811 and 812.

FIG. 8B is a top view of a sheet 801 to be cut into a plurality of ball-side-die packages 800. In this embodiment, a separate rectangular slug of core material 822 is embedded into copper sheet 801 (but not covered by a copper top or bottom layer such as 723 or 724) for each individual package 800, and the cross section is as shown in FIG. 8A in both the X and Y dimension.

FIG. 8C is a top view of a sheet 802 to be cut into a plurality of ball-side-die packages 800'. In the embodiment shown, for each column of packages 800', a stripe of core material 822 extends the length of sheet 802, and thus each package 800' has a stripe of core material extending its length in one direction. The cross section in the X direction is as shown in FIG. 8A, but the core 822 in the Y direction extends the length of the package and has a cross section as shown in FIG. 1. This makes package 802 somewhat easier to make, but somewhat less thermally conductive.

Figure 9:
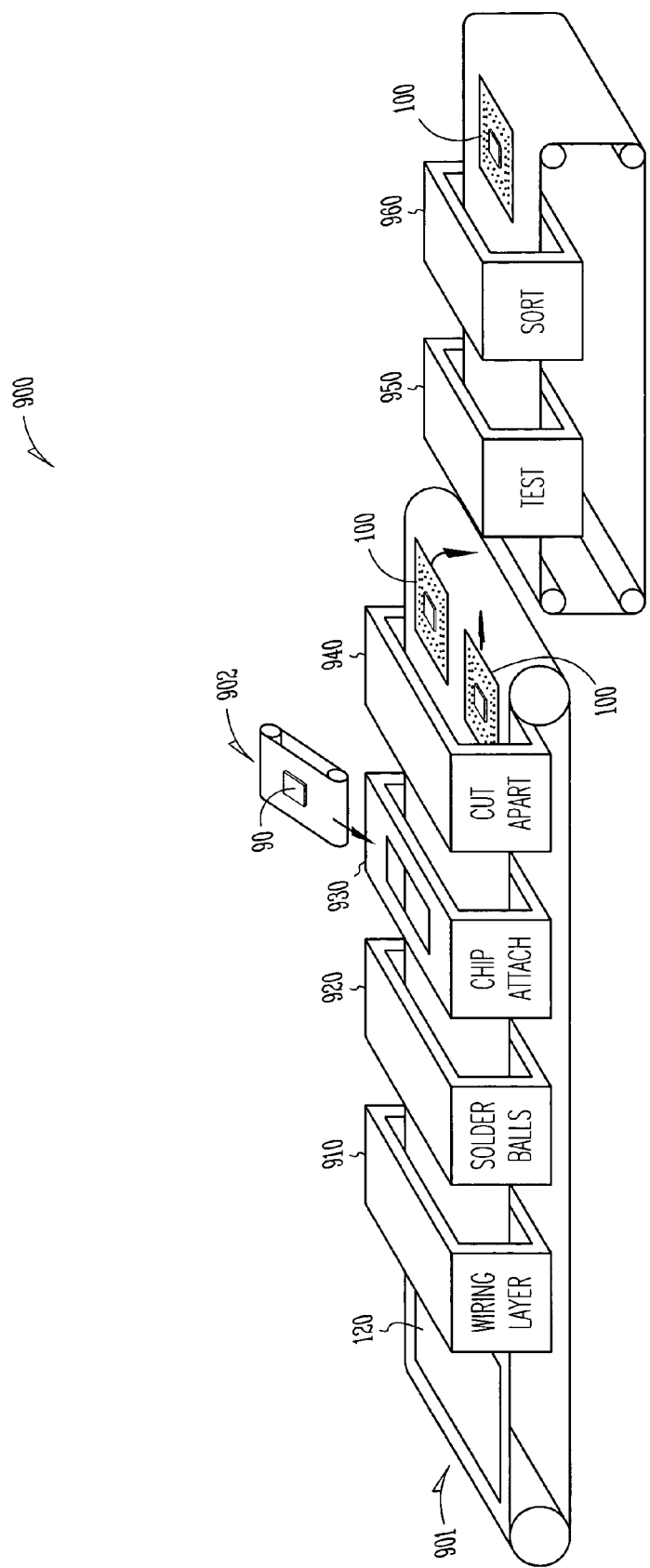
FIG. 9 is a schematic view of a machine 900 that performs a method of the invention.

FIG. 9 is a schematic view of a system or machine 900 that performs a method of some embodiments of the invention. The functions of the method are performed in any suitable order, for example, in the order shown in some embodiments. Some embodiments of the invention include a method and a corresponding apparatus 900 for making electronics packages 100. In some embodiments, the respective apparatus to perform the individual functions as single operation, while in other embodiments, a plurality of smaller machines are used, each performing a sub-operation. In some embodiments, the various machines are connected by an automated conveyor system schematically represented by conveyor 901 that moves the in-process parts between the various stations. The method includes providing (e.g., on conveyor 901) a thermally conductive metal core 120 and providing (e.g., on conveyor 902) a first electronics chip 90. Apparatus 910 performs the function of covering a first face of the metal core 90 with a wiring layer 110 (see FIG. 1) having a plurality of conductive traces (e.g., traces 892 and 893 of FIG. 8) separated from the metal core 120 by an insulating layer (e.g., 811 of FIG. 8), wherein the wiring layer is substantially thinner than the metal core. Apparatus 920 performs the function of forming and attaching solder balls 91 and/or attaching a plurality of external conductors (e.g., solder balls) 93 to the traces of the wiring layer on substrate 120. Apparatus 930 performs the function of attaching the first chip 90 to the traces using a first plurality of solder balls. In some embodiments, a plurality of other chips 90 is also attached to the wiring layer. In some embodiments, apparatus 940 performs the function of cutting apart the individual packages 100. In some embodiments, these individual packages 100 are then tested by apparatus 950 and sorted (e.g., good devices from bad, and/or fast devices from slower) by apparatus 960.

One embodiment of the present invention includes an apparatus 100 that includes a thermally conductive metal core having a first major face and a second major face, and a wiring layer having an electrically insulating layer attached to the first face, and a plurality of electrically conductive traces separated from the metal core by the insulating layer, wherein the metal core is substantially thicker than the wiring layer. The apparatus 100 also includes a first electronics chip attached to at least some of the plurality of traces by ball-grid-array solder balls, and a plurality of external electrical connectors attached to the traces; wherein the second face of the metal core is exposed.

In some embodiments, the metal core has an effective coefficient of thermal expansion (CTE) that matches a CTE of the chip better than substantially pure copper does in a region adjacent to the first chip.

In some embodiments, the metal core comprises a layer of an alloy that includes iron and nickel. In some such embodiments, the layer of iron-nickel alloy has a layer that includes copper attached on the second face. In some such embodiments, the layer of iron-nickel alloy also has a layer that includes copper attached on the first face.

In some embodiments, the layer of iron-nickel alloy has a lateral extent substantially smaller than a lateral extent of the metal core.

In some embodiments, the metal core is electrically connected to the first chip.

In some embodiments, the metal core is electrically connected to a power connection of the first chip.

Some embodiments further include a printed circuit board (PCB) having a plurality of conductive traces, wherein the plurality of external electrical connectors on the first face are electrically connected to the plurality of conductive traces of the PCB, and a first heat sink in thermal contact with the exposed second face of the metal core.

In some such embodiments, the PCB has an opening opposite the first chip, the opening being at least the size of the first chip. Some such embodiments further include a second heat sink in thermal contact with the first chip through the opening.

Some embodiments further include a second electronics chip attached to at least some of the plurality of traces by ball-grid-array solder balls.

In some embodiments, the metal core is about 800 microns thick and the wiring layer is about 40 microns thick.

In some embodiments, the external conductors include a plurality of solder balls, and wherein a thickness of the chip is thinned after formation of electronic circuitry thereon such that the thickness of the chip is smaller than a diameter of the external-conductor solder balls.

Some embodiments of the invention include a method that includes providing a thermally conductive metal core and a first electronics chip, covering a first face of the metal core with a wiring layer having a plurality of conductive traces separated from the metal core by an insulating layer, wherein the wiring layer is substantially thinner than the metal core, attaching the first chip to the traces using a first plurality of solder balls, and attaching a plurality of external conductors to the traces.

In some embodiments of the method, the plurality of external conductors includes a second plurality of solder balls, and wherein an average diameter of the second plurality of solder balls is larger than an average diameter of the first plurality of solder balls.

Some embodiments further include providing a printed circuit board (PCB) having a plurality of conductive traces, electrically connecting the plurality of external electrical connectors on the first face to the plurality of conductive traces of the PCB, and thermally contacting a first heat sink with an exposed second face of the metal core.

Some embodiments further include providing an opening in the PCB, and positioning a thickness of the first chip into the opening.

Some embodiments further include electrically connecting the chip to the metal core.

In some embodiments, providing the metal core includes providing an effective coefficient of thermal expansion substantially smaller than copper at least in a region of the metal core adjacent to the first chip.

In some embodiments, providing the metal core comprises providing a layer of an alloy that includes iron and nickel.

Some embodiments further include covering the layer of iron-nickel alloy with a layer that includes copper on the second face.

Some embodiments further include limiting a lateral extent of the layer of iron-nickel alloy to be substantially smaller than a lateral extent of the metal core.

Some embodiments of the invention include an apparatus that includes an electronics chip 90, and means as described above attached to the chip 90 for conducting heat to an attached heat dissipation device, wherein the heat-conducting means includes means for better matching a coefficient of thermal expansion of the chip.

In some embodiments, the means for conducting heat includes means for better matching a coefficient of thermal expansion of the chip.

Some embodiments further include a first heat sink 310 (see FIG. 3) in thermal contact with the means for conducting heat. Some embodiments further include a second heat sink 320 in thermal contact with the chip 90 on a side of the means for conducting heat opposite the first heat sink.

It is understood that the above description is intended to be illustrative, and not restrictive. Many other embodiments will be apparent to those of skill in the art upon reviewing the above description. The scope of the invention should be, therefore, determined with reference to the appended claims, along with the full scope of equivalents to which such claims are entitled.

What is claimed is:

1. An apparatus comprising:
   a core comprising a layer of an alloy that includes nickel and iron, the core having a first major face and a second major face, wherein the second major face of the core is exposed;
   a wiring layer having an electrically insulating layer coupled to the first major face, and a plurality of electrically conductive traces separated from the core by the insulating layer, wherein the core is substantially thicker than the wiring layer;

a first electronics chip attached to at least some of the plurality of traces by ball-grid-array solder balls; and a plurality of external electrical connectors attached to the traces; and wherein the core has an effective coefficient of thermal expansion (CTE) that matches a CTE of the chip better than substantially pure copper does in a region adjacent to the first chip.

2. The apparatus of claim 1, wherein the layer of iron-nickel alloy has a layer that includes copper attached on the second face.

3. The apparatus of claim 2, wherein the layer of iron-nickel alloy also has a layer that includes copper attached on the first face.

4. The apparatus of claim 1, wherein the layer of iron-nickel alloy has a lateral extent substantially smaller than a lateral extent of the core.

5. The apparatus of claim 1, wherein the core is electrically connected to the first chip.

6. The apparatus of claim 1, wherein the core is electrically connected to a power connection of the first chip.

7. The apparatus of claim 1, further comprising:

a printed circuit board (PCB) having a plurality of conductive traces, wherein the plurality of external electrical connectors on the first face are electrically connected to the plurality of conductive traces of the PCB; and a first heat sink in thermal contact with the exposed second face of the core.

8. The apparatus of claim 7, wherein the PCB has an opening opposite the first chip, the opening being at least the size of the first chip.

9. The apparatus of claim 8, further comprising a second heat sink in thermal contact with the first chip through the opening.

10. The apparatus of claim 1, further comprising a second electronics chip attached to at least some of the plurality of traces by ball-grid-array solder balls.

11. The apparatus of claim 1, wherein the core is about 800 microns thick and the wiring layer is about 40 microns thick.

12. The apparatus of claim 1, wherein the external conductors include a plurality of solder balls, and wherein a thickness of the chip is thinned after formation of electronic circuitry thereon such that the thickness of the chip is smaller than a diameter of the external-conductor solder balls.

* * * * *

UNITED STATES PATENT AND TRADEMARK OFFICE
CERTIFICATE OF CORRECTION

PATENT NO. : 7,268,425 B2
APPLICATION NO. : 10/382680
DATED : September 11, 2007
INVENTOR(S) : Mallik et al.

It is certified that error appears in the above-identified patent and that said Letters Patent is hereby corrected as shown below:

Title page, Item (57), under "Abstract", in column 2, line 6, delete "ore" and insert -- or --, therefor.

Signed and Sealed this

Twenty-seventh Day of May, 2008

JON W. DUDAS
*Director of the United States Patent and Trademark Office*